US010359455B2

(12) United States Patent
Clot et al.

(10) Patent No.: US 10,359,455 B2
(45) Date of Patent: Jul. 23, 2019

(54) METHOD FOR DETECTING A DEFECTIVE MEASUREMENT OF AN EXTENSIVE ELECTRICAL QUANTITY

(71) Applicant: Schneider Electric Industries SAS, Rueil-Malmaison (FR)

(72) Inventors: Sylvain Clot, Eybens (FR); Philippe Deschamps, Le Pont de Claix (FR); Christophe Ligeret, Chelles (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 277 days.

(21) Appl. No.: 15/132,535

(22) Filed: Apr. 19, 2016

(65) Prior Publication Data
US 2016/0313383 A1 Oct. 27, 2016

(30) Foreign Application Priority Data
Apr. 23, 2015 (FR) ...................................... 15 53641

(51) Int. Cl.
*G01R 25/00* (2006.01)
*G01R 35/00* (2006.01)
(Continued)

(52) U.S. Cl.
CPC ....... *G01R 25/005* (2013.01); *G01R 19/2513* (2013.01); *G01R 21/133* (2013.01);
(Continued)

(58) Field of Classification Search
CPC .............. G01R 25/005; G01R 19/2513; G01R 21/133; G01R 31/40; G01R 35/00; G01R 31/086; H02J 13/00; Y04S 20/36
(Continued)

(56) References Cited

U.S. PATENT DOCUMENTS 5,661,664 A * 8/1997 Novosel ................. H02H 3/402
324/512
6,453,248 B1 * 9/2002 Hart ..................... G01R 31/088
324/509
(Continued)

FOREIGN PATENT DOCUMENTS

EP       1 348 970 A1    10/2003

OTHER PUBLICATIONS

French Preliminary Search Report dated Feb. 15, 2016 in French Application 15 53641 filed on Apr. 23, 2015 (with English Translation of Categories of Cited Documents).

*Primary Examiner* — Dzung Tran
(74) *Attorney, Agent, or Firm* — Oblon, McClelland, Maier & Neustadt, L.L.P.

(57) ABSTRACT

In an electric network (1) which comprises an upstream supply (2) and at least two downstream outlets, the supply and the outlets are each provided with a sensor (6) for measuring an extensive electric quantity and each sensor conducts, in a synchronous way with the other sensors, a measurement of this quantity depending on a parameter. This method comprises at least N measurements of the value on the upstream supply and on each downstream outlet conducted for different values of the parameter p. Then, the relationship between the measurements is formalized, for each value of the parameter p with the equation:

$$M(p_j) = \sum_{i=1}^{N} a_i m_i(p_j)$$

A system with N equations and N unknowns is generated, the unknowns being the gains $a_i$, the system of equations is solved, by calculating each gain, and the gains are con- (Continued)

trolled. If all the gains are equal to 1, it is considered that no sensor has conducted a faulty measurement. If at least one of the gains is different from 1, it is considered that at least one sensor has conducted a faulty measurement.

14 Claims, 4 Drawing Sheets

(51) Int. Cl.
    *G01R 19/25*     (2006.01)
    *H02J 13/00*     (2006.01)
    *G01R 21/133*     (2006.01)
    *G01R 31/40*     (2014.01)
    *G01R 31/08*     (2006.01)

(52) U.S. Cl.
    CPC ............. *G01R 31/40* (2013.01); *G01R 35/00* (2013.01); *H02J 13/00* (2013.01); *G01R 31/086* (2013.01); *Y04S 20/36* (2013.01)

(58) Field of Classification Search
    USPC ...................................... 702/60, 58; 700/286
    See application file for complete search history.

(56) References Cited

U.S. PATENT DOCUMENTS

| | | | |
|---|---|---|---|
| 2003/0184936 A1 | 10/2003 | Wimmer et al. | |
| 2006/0085346 A1* | 4/2006 | Riley ....................... | H04L 41/12 705/51 |
| 2007/0005277 A1* | 1/2007 | Bickel .................... | G01D 4/004 702/61 |
| 2011/0184576 A1* | 7/2011 | Hasan .................... | G01D 4/002 700/293 |
| 2012/0136638 A1* | 5/2012 | Deschamps ............ | G01D 4/002 703/2 |
| 2012/0221265 A1 | 8/2012 | Arya et al. | |
| 2014/0032144 A1* | 1/2014 | Kussyk ............... | H02J 13/0006 702/64 |
| 2014/0214218 A1 | 7/2014 | Eldridge et al. | |

* cited by examiner

METHOD FOR DETECTING A DEFECTIVE MEASUREMENT OF AN EXTENSIVE ELECTRICAL QUANTITY

The present invention relates to a method for detecting a faulty measurement of an extensive electric quantity.

In the field of distribution of electricity, it is known to ensure distribution of current to a plurality of electric consumers via an electric distribution network comprising an upstream electric supply, an electric transformation station, notably a HV-MV transformer (high voltage-medium voltage) or a MV-LV transformer (medium voltage-low voltage), and several downstream electrical outlets. Each downstream electrical outlet is a medium voltage or low voltage line and is configured for ensuring distribution of current to a consumer.

In such an electrical distribution network, it is desirable to determine one or several electric quantities, such as the energy, the power or the current, of the upstream supply and of each downstream outlet. A control process on the electric network may thus be generated since the supply and the outlets are monitored. To do this, it is known how to fit the upstream supply, as well as each downstream outlet with one or several measurement sensors. These sensors define a measurement chain of the desired electric quantity and are configured so as to achieve a measurement synchronous with each other.

Now, malfunction of a measurement sensor, positioned upstream or downstream, invalidates all the control process on the electric network. Indeed, a faulty sensor does not give the possibility of identifying a fault or a malfunction of the electric network, which may have significant consequences on the operation of the network and on the electricity distribution.

Document US 2014/214218-A1 is also known from the state of the art.

The object of the invention is therefore to propose a method for detecting a faulty measurement which gives the possibility of reporting in a safe, reliable and rapid way the presence of a malfunction on a measurement sensor.

For this purpose, the object of the invention is a method for detecting a faulty measurement of at least one extensive electric quantity of an electric network comprising an upstream supply and at least two downstream outlets, the supply and the outlets being each provided with a measurement sensor for the extensive electric quantity, each sensor carrying out, in a synchronous way with the other sensors, a measurement of the extensive electric quantity depending on a parameter p, the method being characterized in that it comprises at least N measurements of the value on the upstream supply and on each downstream outlet for different values of the parameter p, and in that once all the measurements are made:

a) the relationship is formalized between the measurements, for each value of the parameter p with the equation:

$$M(p_j) = \sum_{i=1}^{N} a_i m_i(p_j)$$

wherein j is an index of the parameter p, $M(p_j)$ is a measurement of the sensor of the upstream supply for a value $p_j$ of the parameter, N is the number of downstream outlets, i is the initial downstream index varying from 1 to N, $m_i(p_j)$ is a measurement from the downstream outlet sensor of index i for the value $p_j$ of the parameter and $a_i$ is a gain of this measurement;

b) a system with N equations and N unknowns, the unknowns being the gains $a_i$;

c) the system of equations is solved by calculating each gain $a_i$;

d) the gains $a_i$ are controlled and:
  if all the gains are equal to 1, it is considered that no sensor has conducted a faulty measurement;
  if at least one of the gains $a_i$ is different from 1, it is considered that at least one sensor has conducted a faulty measurement.

By means of the invention, each measurement sensor is monitored by means of a gain, i.e. a numerical value, which allows identification in an unambiguous manner of the presence of a faulty measurement within a sensor of the electric network. The computation of the gains is relatively simple since it requires solving a linear system of order N, which is easily achievable and at a low cost with a microprocessor.

According to other advantageous aspects of the invention, the detection method further comprises one or several of the following features, taken individually or according to all the technically acceptable combinations:

a sensor is identified which has conducted a faulty measurement for the parameter via the gain which is associated with it.
  when a gain is different from 1, the sensor with which it is associated is considered as having conducted a faulty measurement
  a corrected value of the faulty measurement is defined from the equation:

$$m'_k(p_j) = M(p_j) - \sum_{i=1, i \neq k}^{N} m_i(p_j)$$

wherein $m'_k$ is the corrected measurement for the value $p_j$ of the parameter, k being the index comprised between 1 and N of the gain different from 1.
  when all the gains have an identical value and are different from 1, the upstream supply sensor is considered as having conducted a faulty measurement.
  a corrected value of the faulty measurement is defined from the following equation:

$$M'_k(p_j) = \sum_{i=1}^{N} m_i(p_j)$$

wherein $M'(p_j)$ is the corrected measurement for the value $p_j$ of the parameter k.
  the type of fault of the sensor which has conducted the faulty measurement is diagnosed.
  when the gain of the faulty measurement varies between two or several measurements for different values of the parameter, the fault is identified as being a random fault.
  when the gain of the faulty measurement remains constant between two or several measurements for different values of the parameter, the fault is identified as a structural fault and inherent to the sensor.
  when the gain of the faulty measurement has a negative value for several measurements for different values of the parameter, the fault is identified as being due to the fact that the sensor is mounted upside down on the corresponding downstream outlet.

a corrected gain is defined from the equation:

$$a'_k = \frac{1}{a_k}$$

wherein k is an index comprised between 1 and N, $a_k$ is the gain associated with the faulty measurement and $a'_k$ is the corrected gain.

the electric network is a multiphase electric network including a number H of electric phases, H being an integer greater than or equal to two, this electric network including a group of H upstream supplies and, for each electric phase, at least two downstream outlets, the upstream supplies and each outlet including a sensor for measuring the extensive electric quantity depending on the parameter p and in that, step a) is applied for each electric phase, in order to formalize the relationship between the measurements of the sensors of this electric phase, in order to detect a fault of a sensor associated with this electric phase.

the sensors which have conducted a faulty measurement are identified by controlling the gains of the measurements of the sensors associated with at least two distinct phases of the electric network.

when the gain of a first faulty measurement of a sensor on an electric phase of the electric network and the gain of a second faulty measurement of another sensor on another electric phase of the electric network are equal, respectively to the ratio of the values of the second and first faulty measurements and to the ratio of the values of the first and second faulty measurements, while the fault is identified as being due to the permutation of these two sensors between these different phases of the electric network.

The method further includes the determination of a phase angle for each value measured by the sensors of a same electric phase of the electric network, the sensor at the origin of the faulty measurement being identified as the one which has a phase angle value corresponding to the difference between the phase angle associated with the measurement from the sensor of the upstream supply on the one hand and, the sum of the phase angles associated with the measurements from the sensors of the downstream outlets for this electric phase on the other hand.

The invention will be better understood and other advantages thereof will become more clearly apparent in the light of the description which follows, only given as a non-limiting example, made with reference to the drawings wherein.

Figure 1:
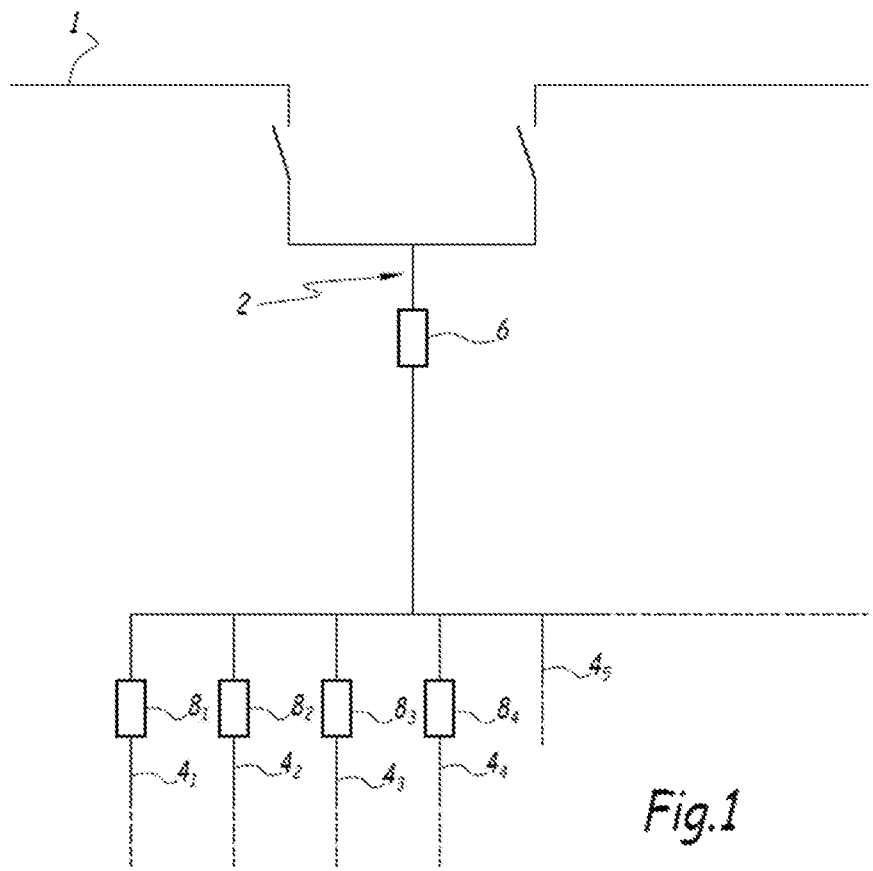
FIG. 1 is a schematic illustration of an electric distribution network comprising an upstream supply, a power supply station and several downstream outlets.

In FIG. 1, an electric distribution network 1, such as a three-phase electric network or a single-phase electric network, is configured for transmitting an electric current via a transformation station. The electric supply of the network upstream is noted as 2 and the electric outlets positioned downstream are also noted as 4. The network 1 is an electric current power supply source for the outlets 4. N downstream outlets $4_i$ are considered, N being an integer greater than or equal to 2 and i an index varying from 1 to N. Each downstream outlet $4_i$ is an electric branch configured for ensuring distribution of current to an electric consumer.

The upstream supply 2 is provided with a sensor 6 for measuring an extensive electric quantity of the network 1, such as the electric current. Alternatively, this extensive quantity may be the electric power, the electric energy, the throughput or harmonics of these quantities.

Each downstream outlet $4_i$ is also provided with a sensor $8_i$ for measuring the electric quantity. In practice, N sensors 8 are present on the N downstream outlets 4.

The measurement sensors 6 and $8_i$ are homogenous and they measure the same extensive quantity which itself is preserved. In the example of FIGS. 1 to 4, the parameter p is the time t and each value of the parameter p is a time instant $t_j$, j being an index of the parameter p.

The sensors 6 and $8_i$ are configured for conducting in a synchronous way with each other, a measurement of the same electric quantity depending on a parameter p. In other words, in order to conduct the measurements, the sensors 6 and $8_i$ are synchronized for example in a radioelectric way. In practice, the sensor 6 is able to send a radioelectric time synchronization signal to the sensors $8_i$.

$M(t_j)$ designates a measurement conducted by the sensor 6 of the upstream supply 2 at the time instant $t_j$. A measurement conducted by the sensor $8_i$ of the downstream outlet $4_i$ at the same instant $t_j$ is noted as $m_i(t_j)$. In practice, the N $8_i$ sensors conduct N measurements $m_i(t_j)$ at the time instant $t_j$.

In a normal operating configuration of the sensors 6 and $8_i$, as the current is an extensive quantity, the sum of the N measurements $m_i(t_j)$ of the sensors $8_i$ of the downstream outlets $4_i$ corresponds to the measurement $M(t_j)$ of the sensor 6 of the upstream supply 2. In other words, the relationship between these measurements may be described with the equation:

$$M(t_j) = \Sigma_{i=1}^{N} m_i(t_j) \qquad \text{(equation 1)}$$

The equation 1 above is exclusively valid in the case when all the sensors 6 and $8_i$ do not have any fault and conduct correct measurements M and $m_i$. Equation 1, as well as all the successive equations, take into account the random uncertainties, errors and measurement uncertainties which characterize all the sensors. Equation 1 is then satisfied at less than one random error.

On the contrary, in the case when one or several conducted measurements is or are faulty, for example equal to a percentage of the correct measurement, equation 1 is not valid.

In order to identify the faulty measurement(s), as well as the faulty sensor(s), the detection method of the invention takes into account a gain $a_i$ assigned to each measurement $m_i$ and formalizes the relationship between the measurements for each instant $t_j$, with the following equation:

$$M(t_j) = \Sigma_{i=1}^{N} a_i m_i(t_j) \qquad \text{(equation 2)}$$

wherein $a_i$ is the gain of the measurement $m_i$. This gain is constant over time.

Equation 2 has N unknowns, i.e. the N gain values $a_i$.

In a way known per se, in order to identify N unknowns of an equation, it is sufficient to formalize a system with N equations. In other words, as equation 2 is derived from a synchronous measurement conducted with the sensors 6 and $8_i$, it is sufficient to conduct N synchronous measurements with the sensors 6 and 8, at N distinct instants $t_j$. Once these N measurements have been made, it is algebraically possible to solve the system of equations and calculate each gain $a_i$.

As the gains $a_i$ are calculated, the values of these gains are controlled and depending on these values, it is possible to identify the presence of one or several faulty measurements M or $m_i$.

Figure 2:
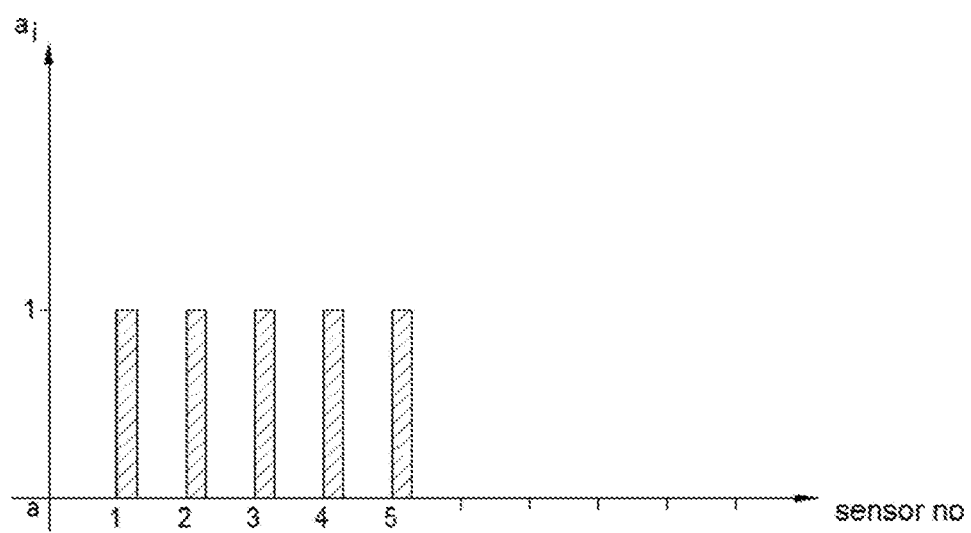
FIG. 2 is a diagram of gains $a_i$, when a method according to the invention is applied and no sensor conducts a faulty measurement.

In particular, if all the gains $a_i$ are equal to 1, as illustrated in FIG. 2, it is considered that no sensor has conducted a faulty measurement. Indeed, when the gains $a_i$ are all equal to 1, equation 2 corresponds, to within less than a random error, to the equation 1 which is then satisfied.

Figure 3:
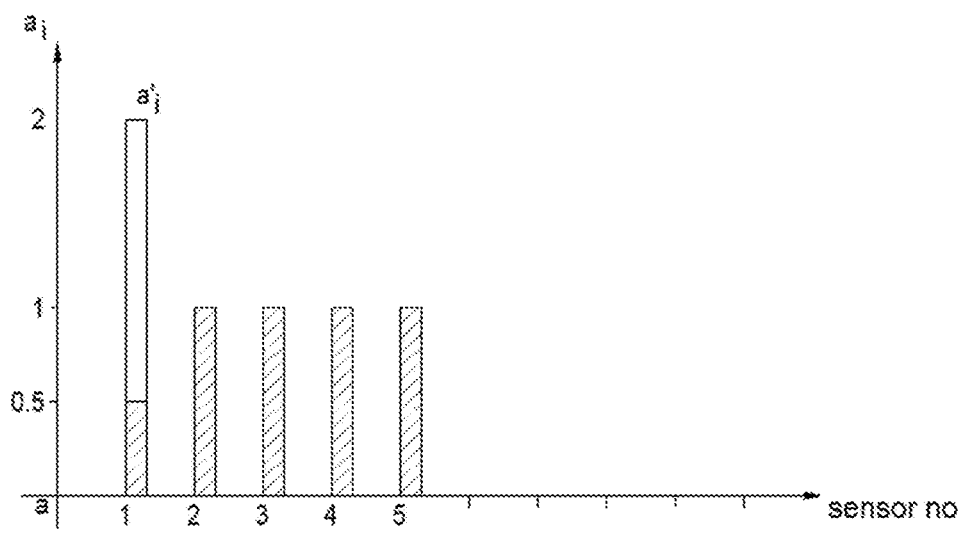
FIG. 3 is a diagram similar to FIG. 2, when a sensor on a downstream outlet conducts a faulty measurement.

On the contrary, if at least one gain $a_k$ (with k being an index comprised between 1 and N) from among the gains $a_i$, is different from 1, as illustrated in FIG. 3 for the gain $a_1$, it is considered that the sensor $8_k$ has conducted a faulty measurement $m_k$. As a non-limiting example, in the example of FIG. 3, the gain $a_1$ has the value 0.5. This value is random: the gain $a_1$ may have any other value different from 1, such as for example 2.

Also, if several gains $a_k$, $a_{k'}$, ... are different from 1, it is considered that several sensors $8_k$, $8_{k'}$ ... have conducted faulty measurements $m_k$, $m_{k'}$, ....

Further, the method gives the possibility of localizing the faulty measurement(s), i.e. it allows recognition of each sensor $8_k$ which has conducted such a faulty measurement.

Indeed, when a gain $a_k$ is different from 1, the sensor $8_k$ with which it is associated is considered as having conducted a faulty measurement $m_k$. For example, as illustrated in FIG. 3, when the gain $a_1$ is different from 1, it is considered that the sensor $8_1$ of the downstream outlet $4_1$ conducts the faulty measurement $m_1$.

Figure 4:
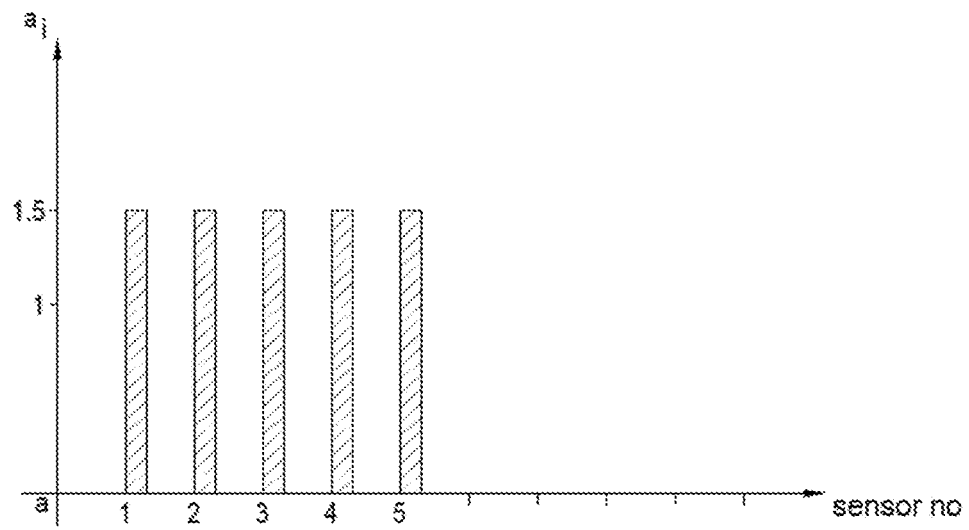
FIG. 4 is a diagram similar to FIG. 2, when the sensor on the upstream supply conducts a faulty measurement.

When all the gains $a_i$ have an identical value and different from 1, as illustrated in FIG. 4, the sensor 6 of the supply upstream 2 is considered as having conducted a faulty measurement M. In the example of FIG. 4, the gains $a_i$ have the value 1.5.

Indeed, if the probability that a sensor $8_i$ is faulty is noted as a, the probability that all the sensors $8_i$ on the outlets $4_i$ are faulty at the same time is equal to $a^{N(1-a)}$. Moreover, the probability that the upstream sensor 6 is faulty is then equal to $a \times (1-a)^N$. Therefore, if the resolution of the system of N equations 2 has the result that all the gains $a_i$ are different from 1, it is considered that the sensor 6 is faulty.

Further, the detection method gives the possibility of defining a correction of a conducted faulty measurement M or $m_k$ by the sensor 6 or $8_k$.

In particular, when the faulty measurement $m_k(t_j)$ is conducted at instant $t_j$ by a sensor $8_k$ of a downstream outlet $4_k$, a corrected value $m'_k(t_j)$ of the measurement $m_k(t_j)$ is calculated from the following equation:

$$m'_k(t_j) = M(t_j) - \Sigma_{i=1, i \neq k}^{N} m_i(t_j) \quad \text{(equation 3)}$$

wherein $m'_k(t_j)$ is the corrected measurement at instant $t_j$.

When the faulty measurement $M(t_j)$ is conducted by the sensor 6 of the upstream supply 2, the method proposes a corrected value $M'(t_j)$ of the faulty measurement which is defined from the following equation:

$$M'(t_j) = \Sigma_{i=1}^{N} m_i(t_j) \quad \text{(equation 4)}$$

wherein $M'_k(t_j)$ is the corrected measurement at instant $t_j$.

The detection method also diagnosis the type of fault of the sensor 6 or $8_k$ which has conducted the faulty measurement M or $m_k$, this by means of the gains $a_i$. Indeed, when the gain $a_k$ of the faulty measurement $m_k$ varies between two or several measurements for different instants $t_j$, the fault is identified as a random fault. In practice, a faulty and random measurement may be a percentage of the correct measurement. A faulty and random measurement may also be background noise.

On the contrary, when the gain $a_k$ of the faulty measurement $m_k$ remains constant between two or several measurements for different instants $t_j$, the fault is identified as a structural fault. In practice, in this case, the sensor may deliver in a constant way, a value 0, a value which varies in proportion with the gain $a_k$ or a scale background value, i.e. the maximum value which the sensor $8_k$ may produce.

The detection method also allows definition of a corrected gain $a'_k$ from the following equation:

$$a'_k = \frac{1}{a_k} \quad \text{(equation 5)}$$

wherein k is the index comprised between 1 and N and $a_k$ is the gain associated with the faulty measurement $m_k$.

The corrected gain $a'_k$ having been calculated, the method allows calculation of a correct measurement $m_i$ at instant $t_j$ from the following relationship:

$$m_i(t_j) = a'_k \times a_k \times m_k(t_j) \quad \text{(equation 6)}$$

Thus, in the case illustrated in FIG. 3 wherein the sensor $8_1$ is located as only delivering 50% of the actual value of the current on the outlet $4_1$, a corrected gain $a'_1$ equal to 2, i.e. 1/0.5, is applied on the values delivered by the sensor $8_1$.

The parameter p, depending on which the sensors 6 and $8_i$ conduct their measurements, may also be one or several harmonics which make up the measurements.

Regardless of the embodiment of the method of the invention, it is possible to conduct a number N' of measurements strictly greater than the number N of unknowns. In this way, the detection method gives the possibility of improving the robustness of the calculation of the gains $a_i$.

In the contemplated embodiments and alternatives, the steps of the method are applied automatically by an electronic unit which comprises an automaton, for example of the microprocessor type.

Figure 5:
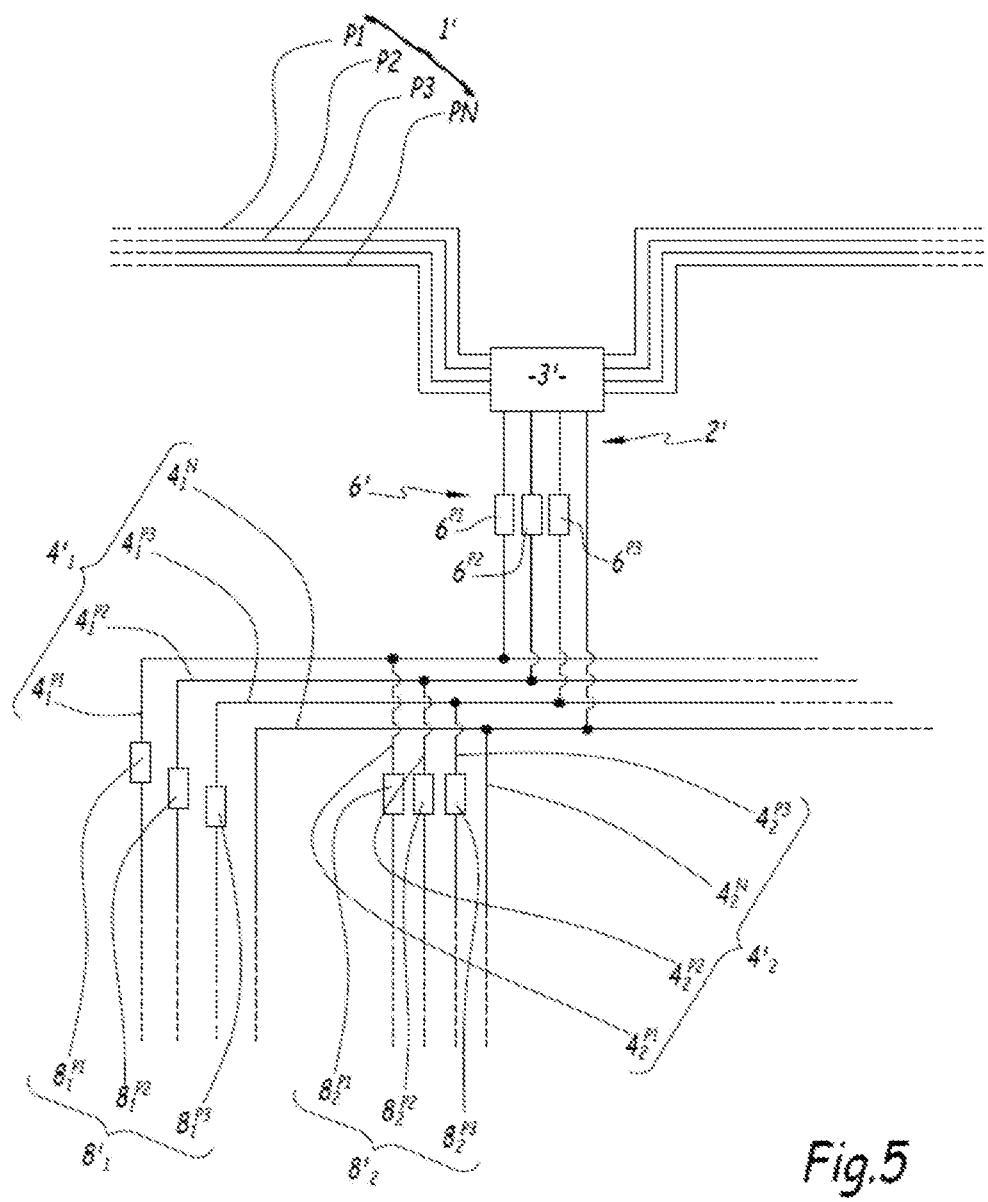
FIG. 5 is a schematic illustration of a multiphase electric distribution network comprising a power supply station and for each phase of this electric network, an upstream supply and several downstream outlets.

FIG. 5 relates to another embodiment of the network 1. In this FIG. 5, the elements similar to those of the network 1 bear the same references. Also, everything which was described with reference to the parameter <<p>> also applies here.

FIG. 5 illustrates a multiphase electric distribution network 1', including a number H of electric phases, H being a number greater or equal to 2. In this example, the network 1' is a three-phase network and for this purpose includes three distinct electric phases P1, P2 and P3, each associated with a distinct electric conductor. The network 1' also includes a neutral electric phase, noted as PN.

Similarly to the network 1, the network 1' is configured for transmitting an electric current via a transformation station 3.

For example, each of the H phases of the network 1', i.e. here the phases P1, P2, P3 and PN, is laid out in the same way as the network 1 when the network 1 is a single phase network. Thus, everything which was described earlier with reference to the network 1 applies to the network formed by each of these H phases.

A group of upstream electric supplies of the network 1 is noted as 2' upstream and a group of electric outlets positioned downstream are noted as 4'$_i$, for "i" comprised between 1 and N. Everything which was described earlier with reference to the electric supply 2 and to the electric outlets 4 respectively applies to the upstream electric supplies of the group 2' and to the downstream electric outlets of the groups 4'$_{i}$, in particular as regards the use of the index i for identifying the groups 4'$_i$. The number N designates here the number of groups 4'$_i$, and corresponds to the number of downstream outlets 4$_i^h$ for each phase.

The outlets corresponding to the phases P1, P2 and P3 are noted as 4$_1^{P1}$, 4$_1^{P2}$ and 4$_1^{P3}$ and the outlet corresponding to the neural phase PN for a first downstream group 4'$_1$ is noted as 4$_1^N$. Also, the outlets corresponding to the phases P1, P2 and P3 are noted as 4$_2^{P1}$, 4$_2^{P2}$ and 4$_2^{P3}$ and the outlet corresponding to the neutral phase PN for a second downstream group 4'$_2$ is noted as 4$_2^N$. In order to simplify FIG. 5, only two groups 4'$_1$ and 4'$_2$ are illustrated. The groups 4'$_1$ and 4'$_2$ each give the possibility of conveying a three-phase current intended for a subscriber to the network 1'.

Each of the phases P1, P2, P3 of the network 1' is provided, at the group 2', with an upstream measurement sensor, similar to the sensor 6, for measuring an extensive electric quantity of the network 1'. This electric quantity is here the electric current, although alternatively, this extensive quantity may be the electric power, the electric energy, the throughput or harmonics of these quantities. The upstream sensor associated with the phase P1 is noted as 6$^{P1}$, the upstream sensor associated with the phase P2 is noted as 6$^{P2}$ and the upstream sensor associated with the phase P3 is noted as 6$^{P3}$. In the following, these sensors are generally referenced as 6$^h$, wherein the index h identifies the corresponding phase. Here, h is equal to one of the phases P1, P2 or P3.

These sensors 6$^h$ form a set 6' of upstream sensors of the network 1'. Here, no sensor 6$^h$ is placed on the neutral phase N.

Each of the phases P1, P2, P3 of the network 1' is also provided, at each group 4'$_i$ with a downstream sensor for measuring the electric quantity, similar to the sensors 8$_i$ described earlier. The upstream sensor associated with the phase P1 is noted as 8$_i^{P1}$, the upstream sensor associated with the phase P2 is noted as 8$_i^{P2}$ and the upstream sensor associated with the phase P3 is noted as 8$_i^{P3}$ for the group 4'$_i$, for "i" comprised between 1 and N. In the following, these sensors are referenced as 8$_i^h$, wherein the index h identifies the corresponding phase as indicated earlier. For each group 4'$_i$, these sensors form a set 8$_i'$ of downstream sensors of the network 1'.

The sensors of the sets 6' and 8$_i'$ respectively play the same role, towards the network 1', than the measurement sensors 6 and 8$_i$ previously described for the network 1.

A measurement conducted by the sensor 6$^h$ is noted as $M^h(t_j)$, a measurement conducted by the sensor 8$_i^h$ is noted as $m_i^h(t_j)$ and the gain associated with the measurement $m_i^h(t_j)$ is noted as $a_i^h$, this gain $a_i^h$ being defined in a similar way to the gain $a_i$ defined earlier.

The methods described with reference to the network 1 also apply here for each of the phases P1, P2 and P3. Thus, for each of the phases P1, P2 and P3, the following equation is formalized for each instant $t_j$:

$$M^h(t_j)=\Sigma_{i=1}^{N}a_i^h m_i^h(t_j) \qquad \text{(equation 7)}$$

The equation 7 has N unknowns, i.e. the N gain values $a_i^h$. By applying equation 7 for each of the phases P1, P2 and P3, a system of equations with 3×N unknowns is obtained, which is solved here in a similar way to the resolution of the system of equations described earlier with reference to the network 1.

Further, the method is applied by taking into account simultaneously measurements from different phases between them, in order to detect the measurement errors. This method more particularly allows detection of an error in placing one or several of the sensors 8$_i^h$.

In a first example, the method advantageously allows detection of whether one of the sensors 8$_i^h$ is mounted upside down on the electric conductor forming the outlet 4$_i^h$. Indeed, the sensors 8$_i^h$ generally have a specific mounting direction which has to be observed when they are installed in the network 1'. This method also applies to the network 1 in order to detect whether one of the sensors 8$_i$ is mounted upside down on an outlet 4$_i$.

As an illustrative and non-limiting example, the case is considered when the sensor 8$_1^{P1}$ is mounted upside down on the outlet 4$_1^{P1}$, i.e. that a portion of the sensor 8$_1^{P1}$ normally oriented along a first direction, is here wrongly oriented towards an opposite direction. This sensor 8$_i^{P1}$ then returns a measurement value $m_1^{P1}(t_j)$ with a sign opposite to the measurement which it should normally return. The measurement $m_1^{P1}(t_j)$ is then said to be faulty. The gain $a_1^{P1}$ of this sensor 8$_1^{P1}$ is therefore equal to <<−1>>. A corrected gain $a'_1{}^{P1}$ equal to $1/a_1^{P1}$ may be used for correcting the measurement sent back by the sensor 8$_1^{P1}$, as indicated earlier.

Thus for the phase P1, the following relationship is satisfied:

$$M^{P1}(t_j)-\Sigma_{i=1}^{N}a_i^{P1}m_i^{P1}(t_j)=2\times m_1^{P1}(t_j) \qquad \text{(equation 8)}$$

When none of the other sensors has any fault, the relationship of equation 7 is observed for the other phases P2 and P3.

The method therefore identifies the presence of the fault on a phase by checking that equation 7 is not satisfied and that equation 8 is satisfied and then identifies the sensor at the origin of the fault by reconciling the measurement value $m_1^{P1}(t_j)$ with the value of the second member of equation 8. The fault is here identified as being due to the mounting upside down of the sensor 8$_1^{P1}$ because the gain $a_1^{P1}$ has a negative value, for example for several instants $t_j$, preferably for all the measurement instants $t_j$.

In a second example, the method advantageously allows detection that two sensors 8$_i^h$ of a same group 4'$_i$ have erroneously been swapped with each other, i.e. each set on an electric conductor associated with an outlet of one of the H phases different from the one on which it would have been normally placed.

As a non-limiting example, the case is considered when the sensors 8$_1^{P1}$ and 8$_1^{P2}$ have been swapped between the phases P1 and P2 at the outlet 4$_1$. More specifically, the sensor 8$_1^{P1}$ is mounted on the outlet 4$_1^{P2}$ instead of being mounted on the outlet 4$_1^{P1}$. The sensor 8$_1^{P1}$ is mounted on the outlet 4$_2^{P1}$ instead of being mounted on the outlet 4$_1^{P2}$. Thus, the sensor 8$_1^{P1}$ returns the measurement value $m_1^{P2}(t_j)$ and the sensor 8$_1^{P2}$ returns the measurement value $m_1^{P1}(t_j)$. The measurements $m_1^{P2}(t_j)$ and $m_1^{P1}(t_j)$ are then said to be faulty.

These faulty measurements are detected because, for the phases P1 and P2 on which are found the incriminated sensors 8$_1^{P1}$ and 8$_1^{P2}$ and for several measurement instants $t_j$, preferably for all the measurement instants $t_j$, the equality of equation 7 is not satisfied but instead the following relationship is satisfied:

$$M^{P1}(t_j) - \Sigma_{i=1}^{N} a_i^{P1} m_i^{P1} m_i^{P1}(t_j) = -(M^{P1}(t_j) - \Sigma_{i=1}^{N} a_i^{P2} m_i^{P2}(t_j)))$$ (equation 9)

On the contrary, when none of the other sensors has any default, the relationship of the equation 7 is observed for the phase P3.

The gain $a_1^{P1}$ is therefore equal to « $m_1^{P2}(t_j)/m_1^{P1}(t_j)$ » and the gain $a_1^{P2}$ is equal to « $m_1^{P1}(t_j)/m_1^{P2}(t_j)$ ».

In a third example, the method advantageously allows detection of whether one of the sensors $8_i^h$ is erroneously mounted on the neutral phase of the group $4'_i$, instead of being mounted on one of the electric conductors associated with an outlet $4_i^h$ of one of the H phases.

As a non-limiting example, the case is considered when the sensor $8_1^{P3}$ is erroneously mounted on the outlet $4_1^N$ associated with the neutral PN of the group $4'_1$ instead of being mounted on the outlet $4_1^{P3}$ associated with the phase P3. The sensor $8_1^{P3}$ therefore conducts a faulty measurement.

It is known that in a multiphase electric network, the value of the electric quantity in the neutral phase may be reconstructed from measured values of the same electric quantity in the other phases present beside the neutral. Such reconstructed values are therefore used from the values measured by the sensors $6^h$ and $8_i^h$. In the case of the three-phase network $1'$, these reconstructed values are calculated as follows:

$$M^{PN}(t_j) = -(M^{P1}(t_j) + M^{P2}(t_j) + M^{P3}(t_j))$$ (equation 10)

$$m_i^{PN}(t_j) = -(m_i^{P1}(t_j) + m_i^{P2}(t_j) + m_i^{P3}(t_j))$$ (equation 11)

The faulty measurement is detected because the value $M^{PN}(t_j)$ is not equal to the sum of the values $m_i^{PN}(t_j)$ and that for the phase P3 on which is found the incriminated sensor, the equality of equation 7 is not satisfied and instead the following relationship is satisfied:

$$M^{P3}(t_j) \neq \Sigma_{i=1}^{N} a_i^{P3} m_i^{P3}(t_j)$$ (equation 12)

When none of the other sensors has any fault, the relationship of equation 7 is observed for the other phases P1 and P2.

Figure 6:
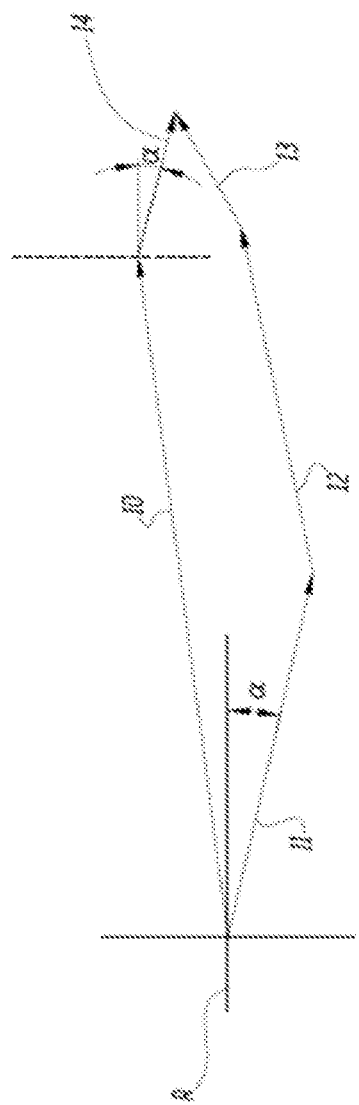
FIG. 6 is a Fresnel diagram illustrating vector values measured within the electric network of FIG. 1 or 5.

FIG. 6 relates to another advantageous application of the method used in the network $1'$. The method allows detection of the presence of a constant measurement error of the offset type. In such a scenario, for one of the sensors associated with a given phase, an error value is constantly added overtime to the value measured by this sensor. The method described earlier is applied for identifying the existence of an erroneous measurement.

In order to identify the outlet $4'$, on which is placed the faulty sensor, it is possible to measure the phase angle associated with the offset between the measurement $M^h(t_j)$ and the sum of the measurements $m_i^h(t_j)$ for this phase, and to compare this offset with each of the phase angles associated with the measurements $m_i^h(t_j)$ for this phase on the other hand.

In this illustrative example, the case is considered when the electric network includes three outlets $4_i^h$ here for a single and same phase h. FIG. 6 illustrates measurements conducted by the sensors $6^h$ and $8_i^h$ of this network, in a vector form according to a Fresnel diagram and with respect to a predefined reference system R.

More specifically, the vector 10 corresponds to the measurement $M(t_j)$ conducted by the 6 of this same phase. The vectors 11, 12 and 13 respectively correspond to the values of the measurements $m_i^h(t_j)$ conducted by the sensors $8_i^h$ associated with the three outlets for this phase. The vector 14 corresponds to the vector difference, or offset between the vector 10 and the sum of the vectors 11, 12 and 13. The phase angle associated with the value of the offset is noted as α, i.e. with the vector 14, and defined with respect to the reference system R. This angle α is compared with each of the angles of the vectors 10, 11, 12 and 13 defined relatively to the same reference system R. The angle α is here equal to the difference between the phase angle associated with the measurement of the sensor 6, of the upstream supply on the one hand and the sum of the phase angles associated with the measurements of the sensors $8_i^h$ of the downstream outlets for this electric phase.

The sensor at the origin of the fault is identified as being the one which has an electric phase angle corresponding to the angle α associated with the offset. By <<corresponding>>, is meant here that the electric phase angle is equal, preferably to within 2%, still more preferably to within 5%, and modulo 180°, to the angle α associated with the offset. Here, it is the vector 11 which has a phase angle equal to the angle α, which expresses the fact that it is the sensor $8_1^h$ of the outlet $4_i^h$ which is faulty.

When no sensor corresponds to the phase angle associated with the offset but that this angle is equal to the phase angle associated with the measurement $M(t_j)$ conducted by the head sensor 6, then the head sensor 6 is said to be faulty. Indeed, the probability that all the sensors $8_i$ or $8_i^h$ of this phase are simultaneously faulty, at the same measurement instant $t_j$ and with the same offset is extremely low.

The embodiments and the contemplated alternatives above may be combined with each other for generating new embodiments of the invention.

The invention claimed is:

1. A method for detecting a faulty measurement of at least one extensive electric quantity of an electric network comprising an upstream supply and at least two downstream outlets, the supply and the outlets being each provided with a sensor for measuring the extensive electric quantity, each sensor conducting, in a synchronous way with other sensors, a measurement of the extensive electric quantity depending on a parameter p, the method comprising:
   performing at least N measurements of the value on the upstream supply and on each downstream outlet conducted for different values of the parameter p, and once the measurements have been performed:
   a) formalizing a relationship between the measurements, for each value of parameter p with equation:

$$M(p_j) = \sum_{i=1}^{N} a_i m_i(p_j)$$

wherein j is an index of the parameter p, $M(p_j)$ is a measurement of the sensor of the upstream supply for a value $p_j$ of the parameter, N is the number of downstream outlets, i is the downstream outlet initial index varying from 1 to N, $m_i(p_j)$ is a measurement from the sensor of the downstream outlet of index i for the value $p_j$ of the parameter and $a_i$ is a gain of this measurement;
   b) generating a system of N equations and N unknowns, the unknowns being the gains $a_i$;
   c) solving the system of equations by calculating each gain $a_i$;

d) controlling the gains $a_i$ and:
   when all the gains are equal to 1, determining that no sensor has conducted a faulty measurement, and
   when at least one of the gains $a_i$ is different from 1, determining that at least one sensor has conducted a faulty measurement; and
e) when the gain of the faulty measurement has a negative value for several measurements for different values of the parameter, determining that a fault of the sensor which has conducted the faulty measurement is due to the sensor being mounted upside down on the corresponding downstream outlet.

2. The method according to claim 1, further comprising identifying a sensor which has conducted a faulty measurement for the parameter via the gain which is associated with the sensor.

3. The method according to claim 2, wherein when a gain is different from 1, determining that the sensor with which it is associated has conducted a faulty measurement.

4. The method according to claim 3, wherein a corrected value of the faulty measurement is defined from equation:

$$m'_k(p_j) = M(p_j) - \sum_{i=1, i \neq k}^{N} m_i(p_j)$$

wherein $m'_k(p_j)$ is the corrected measurement for the value $p_j$ of the parameter, k being the index comprised between 1 and N of the gain different from 1.

5. The method according to claim 2, wherein, when all the gains have an identical value and different from 1, determining that the sensor of the upstream supply has conducted a faulty measurement.

6. The method according to claim 5, wherein a corrected value of the faulty measurement is defined from following equation:

$$M'_k(p_j) = \sum_{i=1}^{N} m_i(p_j)$$

wherein $M'(p_j)$ is the corrected measurement for the value $p_j$ of the parameter k.

7. The method according to claim 1, wherein, when the gain of the faulty measurement varies between two or several measurements for different values of the parameter, determining the fault as a random fault.

8. The method according to claim 1, wherein, when the gain of the faulty measurement remains constant between two or several measurements for different values of the parameter, determining the fault as a structural default and inherent to the sensor.

9. The method according to claim 8, wherein a corrected gain is defined from equation:

$$a'_k = \frac{1}{a_k}$$

wherein k is an index comprised between 1 and N, $a_k$ is the gain associated with the faulty measurement and $a'_k$ is the corrected gain.

10. The method according to claim 1, wherein the electric network is a multiphase electric network including a number H of electric phases, H being an integer greater than or equal to two, the electric network including a group of H upstream supplies and, for each electric phase, at least two downstream outlets, the upstream supplies and each outlet including a sensor for measuring the extensive electric quantity depending on the parameter p and wherein, the step a) is applied for each electric phase, in order to formalize the relationship between the measurements of the sensors of the electric phase, in order to detect a fault of a sensor associated with this electric phase.

11. The method according to claim 10, further comprising identifying the sensors which have conducted a faulty measurement by controlling the gains of the measurements from the sensors associated with at least two distinct phases of the electric network.

12. The method according to claim 11, wherein, when the gain of a first faulty measurement of the sensor on the electric phase of the electric network and the gain of a second faulty measurement of another sensor on another electric phase of the electric network are equal, respectively to the ratio of the values of the second and first faulty measurements and to the ratio of the values of the first and second faulty measurements, identifying determining the fault as being due to swapping of both of these two sensors between these different phases of the electric network.

13. The method according to claim 1, further comprising determining a phase angle for each value measured by the sensors of a same electric phase of the electric network, the sensor at the origin of the faulty measurement being identified as the one which has a value of a phase angle corresponding to the difference between the phase angle associated with the measurement of the sensor of the upstream supply on the one hand and a sum of the phase angles associated with the measurements of the sensors of the downstream outlets for the electric phase on the other hand.

14. A device for detecting a faulty measurement of at least one extensive electric quantity of an electric network comprising an upstream supply and at least two downstream outlets, the supply and the outlets being each provided with a sensor for measuring the extensive electric quantity, each sensor conducting, in a synchronous way with other sensors, a measurement of the extensive electric quantity depending on a parameter p, the device comprising:
   processing circuitry configured to perform at least N measurements of the value on the upstream supply and on each downstream outlet conducted for different values of the parameter p, wherein once the measurements have been performed, the processing circuitry is further configured to
   formalize a relationship between the measurements, for each value of parameter p with equation:

$$M(p_j) = \sum_{i=1}^{N} a_i m_i(p_j)$$

wherein j is an index of the parameter p, $M(p_j)$ is a measurement of the sensor of the upstream supply for a value $p_j$ of the parameter, N is the number of downstream outlets, i is the downstream outlet initial index varying from 1 to N, $m_i(p_j)$ is a measurement from the sensor of the downstream outlet of index i for the value $p_j$ of the parameter and $a_i$ is a gain of this measurement, generate a system of N equations and N unknowns, the unknowns being the gains $a_i$,
solve the system of equations by calculating each gain $a_i$, control the gains a and:
when all the gains are equal to 1, determine that no sensor has conducted a faulty measurement, and
when at least one of the gains $a_i$ is different from 1, determine that at least one sensor has conducted a faulty measurement, and
when the gain of the faulty measurement has a negative value for several measurements for different values of the parameter, determine that a fault of the sensor which has conducted the faulty measurement is due to the sensor being mounted upside down on the corresponding downstream outlet.

* * * * *